(12) United States Patent
Matsuoka et al.

(10) Patent No.: US 8,197,913 B2
(45) Date of Patent: Jun. 12, 2012

(54) FILM FORMING METHOD FOR A SEMICONDUCTOR

(75) Inventors: Takaaki Matsuoka, Miyagi (JP); Kohei Kawamura, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 834 days.

(21) Appl. No.: 12/008,770

(22) Filed: Jan. 14, 2008

(65) Prior Publication Data

US 2009/0029066 A1 Jan. 29, 2009

Related U.S. Application Data

(60) Provisional application No. 60/961,942, filed on Jul. 25, 2007.

(51) Int. Cl.
*H05H 1/24* (2006.01)

(52) U.S. Cl. .......................... 427/569; 427/574; 427/578

(58) Field of Classification Search .................. 427/569, 427/574, 578
See application file for complete search history.

(56) References Cited

U.S. PATENT DOCUMENTS

| 6,458,718 | B1 * | 10/2002 | Todd .............................. 438/778 |
| 7,374,620 | B2 * | 5/2008 | Ohmi et al. .................... 118/715 |
| 7,776,736 | B2 * | 8/2010 | Kobayashi et al. ........... 438/622 |
| 2003/0124876 | A1 * | 7/2003 | Toyoda et al. ................ 438/785 |
| 2003/0168008 | A1 * | 9/2003 | Ohmi et al. .................... 118/715 |
| 2005/0250346 | A1 * | 11/2005 | Schmitt ......................... 438/778 |
| 2006/0264044 | A1 * | 11/2006 | Kobayashi et al. ........... 438/680 |
| 2006/0273319 | A1 * | 12/2006 | Dairiki et al. ................. 257/66 |
| 2007/0160774 | A1 * | 7/2007 | Tsukada et al. ............... 427/579 |
| 2007/0228527 | A1 * | 10/2007 | Kobayashi ..................... 257/635 |

FOREIGN PATENT DOCUMENTS

| JP | 2005-150612 | | 6/2005 |
| WO | WO 00/74127 | A1 | 12/2000 |
| WO | WO2005109483 | A1 * | 11/2005 |

* cited by examiner

*Primary Examiner* — Bret Chen

(57) ABSTRACT

The present invention is a plasma processing method for forming a film on a substrate, the method including the steps of processing a first material gas with plasma having an electron density W and an electron temperature X, processing a second material gas with plasma having an electron density Y, which is different from the electron density W, and an electron temperature Z, which is different from the electron temperature X, and forming the film on the substrate by reacting the processed first material gas and the processed second material gas.

22 Claims, 5 Drawing Sheets

FILM FORMING METHOD FOR A SEMICONDUCTOR

This application claims priority to U.S. Provisional Application Ser. No. 60/961,942, filed on Jul. 25, 2007, entitled "Method for Semiconductor Deposition", which is incorporated herein by reference in its entirety.

TECHNICAL FIELD

The present invention relates to a method for forming a film on a substrate. The method is applicable to semiconductor devices, liquid crystal display devices, and organic EL elements.

BACKGROUND OF THE INVENTION

In a manufacturing process for electronic devices, such as semiconductor devices, liquid crystal display devices, and organic electro-luminescent (EL) elements, a film forming process is performed to form a conductive film (CF) or an insulating film on the surface of a substrate. A plasma film forming process for forming a film on a substrate using plasma is employed in this film forming process. In a case when forming a CF film on a substrate, and further forming an insulating film on the CF film in the film forming process, there has been a problem that the fluorine atom in the CF film diffuses in the insulating film, thereby the contactablity of the CF film and the insulating film decreases. Also, there has been a problem that the insulation film may peel off due to corrosion of the insulating film by the fluorine atom diffused in the insulating film when the CF film and the insulating film are heat treated at a subsequent film forming process.

By the way, the above plasma film forming process is normally performed by a plasma film forming device. In recent years, a microwave plasma film forming device, which forms a film by generating plasma by a microwave field, has been attracting attention as a type of plasma film forming device. According to this microwave plasma film forming device, high-density plasma compared to the conventional film forming devices can be obtained, thereby the film forming process to the substrate can be performed effectively in a short time.

The microwave plasma film forming device described above is provided with, for example, a placing base to place a substrate inside a treatment vessel. And on the upper portion of the treatment vessel, provided are radial line slot antennas, and a shower ring to pass through the microwave from the radial line antennas that supply plasma gas. Further, the microwave plasma film forming device employs a supply material gas for film from the wall surface of the treatment vessel.

As a plasma processing method for forming a film using the microwave plasma film forming device, for example, the following has been known. For example, Japanese Published Unexamined Patent Application No. 2005-093737 discloses a plasma processing method for forming a film on a substrate which is capable of forming a high quality film with a low temperature in a short time by optimizing the amounts of radicals and ions supplied to the substrate. Also, Japanese Published Unexamined Application No. 2006-324023 discloses a plasma film forming device capable of minimizing deformation or distortion of the shower ring by maintaining the temperature of the shower ring to a desired temperature, and improving the uniformity of an in-plane temperature of the shower ring.

Also, Japanese Published Unexamined Patent Application No. 2005-150612 discloses a plasma film forming device which prevents the gas for plasma excitation from plasmanizing before it is supplied to the treatment vessel, and appropriately generates plasma within the area of a high-frequency wave supplying side, that is, a plasma generating area. Further, International Published Unexamined Patent Application No. 2000-74127 discloses a plasma process device capable of maintaining the stability of the plasma regardless of the type of gas used for the process because there is no film attachment on the surface of the dielectric shower ring of the microwave introduction part due to dissociation or binding of the gas for processing.

However, by using any of the methods described in the documents above, improvement in the heat resistance of the film formed on the substrate, or prevention of the excessive disassociation of the film could not be achieved sufficiently. As a result, there has been a problem with a deterioration in the contactablity between the films formed on the substrate. Also, with respect to the film formed on the substrate, there has been a demand for the characteristics capable of functioning in various conditions. Further, with respect to manufacturing costs, omission of a manufacturing process and reduction of the material cost have been desired.

SUMMARY OF THE INVENTION

One aspect of the present invention is a plasma processing method for forming a film on a substrate by processing the substrate with plasma, the method including the steps of processing a first material gas with plasma having an electron density W and an electron temperature X, processing a second material gas with plasma having an electron density Y, which is different from the electron density W, and an electron temperature Z, which is different from the electron temperature X, and forming the film on the substrate by reacting the first processed material gas and the second processed material gas.

In a case when the method described above is used for further forming a film on the film formed on the substrate, the film can be formed on an area with high-electron density and low-electron temperature, thus excessive disassociation of the film can be prevented. When the film is excessively disassociated, it becomes an etching species and is unable to contribute to film forming. When excessive disassociation of the film can be prevented, the film becomes a forming species, thereby the contactability between the films can be improved. Also, the film formed by using the method described above significantly improves heat resistance (allowable temperature limit).

Further, by using the method described above, a film with various characteristics can be formed. Also, by using the method described above, a film having various constitutional components can be formed. Thus, the characteristics of the film and the constitutional components can be controlled.

Further, in a case when the same type of gases are used in the method described above, the conditions of disassociation for both are different because the electron density or the electron temperature on the area supplied with each gas are different. As a result, the gas components, if different types of gases are utilized, may coexist in the area. Therefore, low-cost gases may be utilized instead of high cost gases. And, the film with a construction similar to that of the film formed by using high-cost gas, can be formed.

The present invention may be a plasma processing method, wherein each value of the electron densities W and Y is in a range of $6.0\times10^{10}/cm^3$ to $5.0\times10^{11}/cm^3$, and each value of the electron temperatures X and Z is in a range of 0.70 eV to 1.20 eV.

The present invention may be a plasma processing method, wherein each value of the electron densities W and Y is in a range of $8.0\times10^{10}/cm^3$ to $5.0\times10^{11}/cm^3$, and each value of the electron temperatures X and Z is in a range of 0.70 eV to 1.10 eV.

The present invention may be a plasma processing method, wherein each value of the electron densities W and Y is in a range of $1.0\times10^{11}/cm^3$ to $5.0\times10^{11}/cm^3$, and each value of the electron temperatures X and Z is in a range of 0.80 eV to 1.00 eV.

The present invention may be a plasma processing method, wherein at least one value of the electron densities W and Y are controlled with time.

The present invention may be a plasma processing method, wherein at least one value of the electron temperatures X and Z are controlled with time.

By adjusting the electron density or the electron temperature with time by utilizing the method described above, a film with more characteristics and a film having more constitutional components can be formed. Thereby the characteristics of the film and the constitutional components of the film can be controlled more effectively. Also, the manufacturing cost can be reduced by utilizing a low-cost material instead of a high-cost material.

The present invention may be a plasma processing method, wherein each value of the electron densities W and Y for forming an interior component of the film is different from each value of the electron densities W and Y for forming a superficial component of the film.

The present invention may be a plasma processing method, wherein each value of the electron temperatures X and Z for forming an interior component of the film is different from each value of the electron temperatures X and Z for forming a superficial component of the film.

By using the method described above to change the electron temperature and the electron density, the film superficial composition and interior composition can be changed. For example, the film superficial structure is high in dielectric constant and mechanical strength, however, it may be configured to a structure relatively low in mechanical strength and low in dielectric constant. Further, in order to increase the mechanical strength or the thermal strength of the film, a post film forming process called cure is generally used for a Low k material, however, such a process can be eliminated by using the method described above.

The present invention may be a plasma processing method, wherein the method includes the steps of flowing the first material gas into a first area to process the first material gas with the plasma, and flowing the second material gas into a second area to process the second material gas with the plasma.

By changing the flow ratio of the material gas using the method described above, a film with various characteristics or a film having various constitutional components compared to those described above can be formed. Thereby the characteristics of the film and constitutional components of the film can be controlled more effectively. Also, the manufacturing cost can be reduced by using a low-cost material instead of a high-cost material.

The present invention may be a plasma processing method, wherein a first area is an area near a substrate and a second area is an area away from the substrate.

The present invention may be a plasma processing method, wherein the method includes a step of controlling a flow ratio of a first material gas and a second material gas.

The present invention may be a plasma processing method, wherein the flow ratio is controlled with time.

The present invention may be a plasma processing method, wherein the flow ratio for forming an interior component of the film is different from the flow ratio for forming a superficial component of the film.

One aspect of the present invention is a processing method for producing a film on a substrate, the method comprising the steps of treating a first material gas under a circumstance of an electron density W and an electron temperature X, treating a second material gas under a circumstance of an electron density Y, which is different from the electron density W, and an electron temperature Z, which is different from the electron temperature X, and producing the film on the substrate by reacting the first treated material gas and the second treated material gas.

In a case when the method described above is used for further forming a film on the film formed on the substrate, the film can be formed on the area with high-electron density and low-electron temperature, thereby excessive disassociation of the film can be prevented. When the film is excessively disassociated, it becomes an etching species and is unable to contribute to forming. When excessive disassociation of the film can be prevented, the film becomes a forming species, thereby the contactability between the films can be improved. Also, the film formed by using the method described above significantly improves heat resistance (allowable temperature limit).

Further, by using the method described above, a film with various characteristics can be formed. Also, by using the method described above, a film having various constitutional components can be formed. Thus, the characteristics of the film and the constitutional components of the film can be controlled.

Further, in a case when the same type of gases are used in the method described above, the conditions of disassociation for both are different because the electron density or the electron temperature on the area supplied with each gas are different. As a result, the gas components, if different types of gases are utilized, may coexist in the area. Therefore, for example, low-cost gases may be utilized instead of high cost gases. And, the film with a construction similar to that of the film formed by using a high-cost gas, can be formed.

The present invention may be a processing method, wherein each value of the electron densities W and Y is in a range of $6.0\times10^{10}/cm^3$ to $5.0\times10^{11}/cm^3$, and each value of the electron temperatures X and Z is in a range of 0.70 eV to 1.20 eV.

The present invention may be a processing method, wherein each value of the electron densities W and Y is in a range of $8.0\times10^{10}/cm^3$ to $5.0\times10^{11}/cm^3$, and each value of the electron temperatures X and Z is in a range of 0.70 eV to 1.10 eV.

The present invention may be a processing method, wherein each value of the electron densities W and Y is in a range of $10\times10^{11}/cm^3$ to $5.0\times10^{11}/cm^3$, and each value of the electron temperatures X and Z is in a range of 0.80 eV to 1.00 eV.

The present invention may be a processing method, wherein at least one value of the electron densities W and Y are controlled with time.

By adjusting the electron density or the electron temperature with time using the method described above, a film with more characteristics or a film having more constitutional components compared to those described above can be formed. Thereby the characteristics of the film and the constitutional components of the film can be controlled. Also, the manufacturing cost can be reduced by using a low-cost material instead of a high-cost material.

The present invention may be a processing method, wherein the method includes the steps of flowing the first material gas into a first area to treat the first material gas, and flowing the second material gas into a second area to treat the second material gas.

The present invention may be a method, wherein the method includes a step of controlling a flow ratio of the first material gas and the second material gas.

By changing the flow ratio of the material gas using the method described above, a film with various characteristics or a film having various constitutional components compared to those described above can be formed. Thereby the characteristics of the film and constitutional components of the film can be controlled more effectively. Also, the manufacturing cost can be reduced by using a low-cost material instead of a high-cost one.

DETAILED DESCRIPTION OF THE INVENTION

Figure 1:
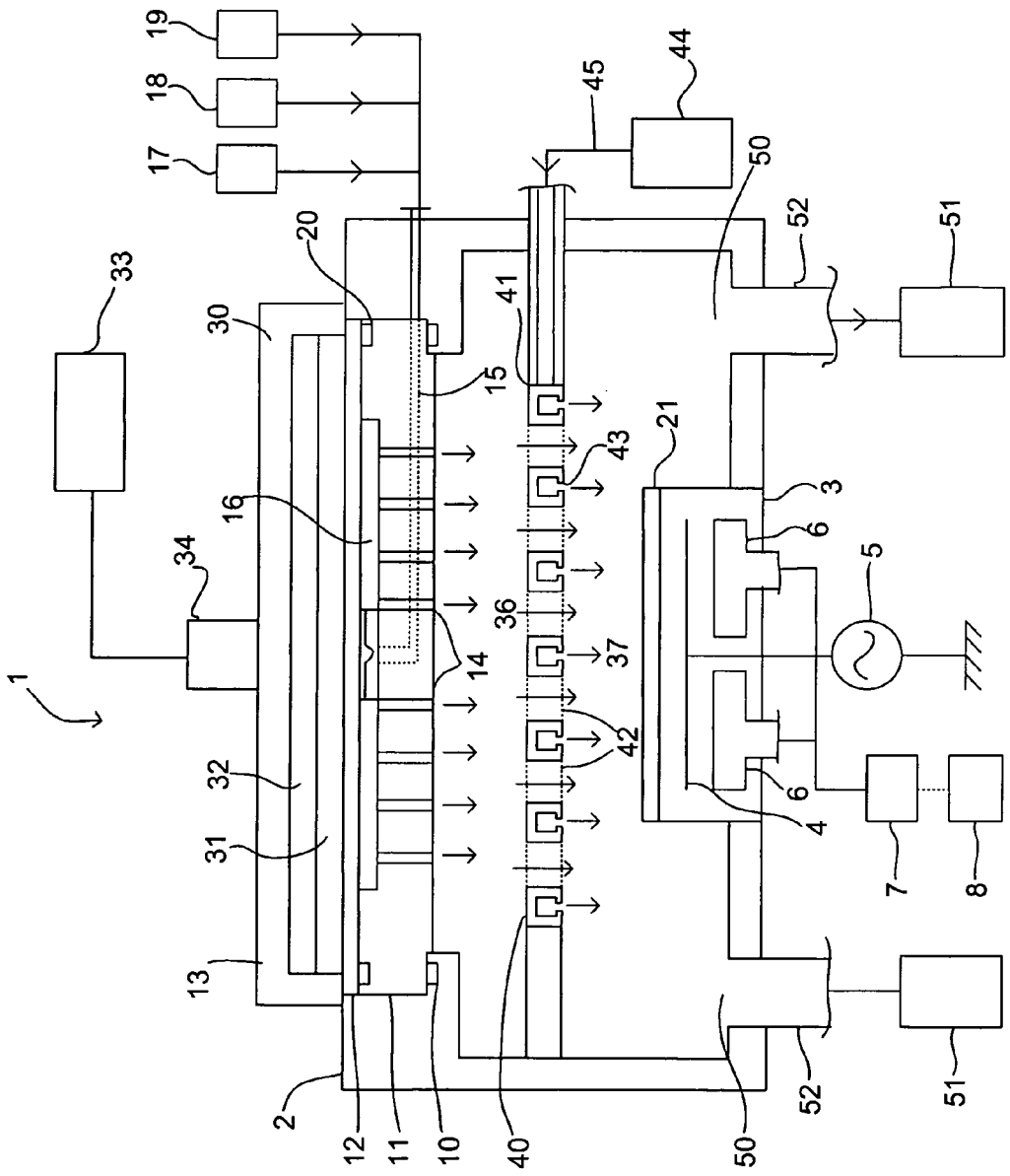
FIG. 1 is a schematic view of a longitudinal section showing a plasma film forming device according to the present invention.

One aspect of the present invention is a method for forming a film on a substrate. This aspect of the present invention is characterized by processing a plurality of material gases with different electron densities, or under different electron temperature environments, and forming a film by reacting the processed material gasses.

In order to achieve the effect of the present invention, the electron density and the electron temperature need to be adjusted. To create an atmosphere of the electron density and the electron temperature that is capable of achieving the effect of the present invention, for example, plasma needs to be generated. By generating a plasma, an environment with high electron density and low electron temperature can be created.

As a device for generating the plasma, for example, a CVD (Chemical Vapor Deposition) device, which generates plasma using radial line slot antennas (RLSA), may be considered. In order to form a film having the characteristics of the present invention, the CVD device is preferable. And when, for example, an ICP (Inductively Coupled Plasma) device is used, a film having the effect of the present invention can not be formed. This is because the electron temperature is too high compared to the CVD device when using the ICP device, thus, the film is excessively degraded.

The electron density of the present invention is preferably approximately $6.0 \times 10^{10}/cm^3$ to $5.0 \times 10^{11}/cm^3$, more preferably approximately $8.0 \times 10^{10}/cm^3$ to $5.0 \times 10^{11}/cm^3$, and the most preferably approximately $1.0 \times 10^{11}/cm^3$ to $5.0 \times 10^{11}/cm^3$. Also, the electron temperature according to the present invention is preferably approximately 0.70 eV to 1.20 eV, more preferably approximately 0.70 eV to 1.10 eV, and the most preferably approximately 0.80 eV to 1.00 eV. The electron density and the electron temperature according to the present invention can be adjusted as needed according to characteristics or components of the film to be formed.

In the present invention, the electron density and the electron temperature may be adjusted by utilizing, for example, the CVD device. The adjustment of the electron density or the electron temperature may be performed with time, or by each predetermined step. In a case when adjusting the electron density or the electron temperature with time, for example, the electron density or the electron temperature may be changed by the second, or the electron density or the electron temperature may be changed by the hour. On the other hand, in a case when adjusting the electron density or the electron temperature by each predetermined step, for example, the electron density or the electron temperature for forming an interior component and the electron density or the electron temperature for forming a superficial component may be changed.

By supplying a material gas to the area where the electron density and the electron temperature are adjusted as described above, a film with various characteristics, or a film having various types of components may be formed. As a material gas, for example, methylsilane (such as mono-methylsilane, di-methylsilane, tri-methylsilane, or tetra-methylsilane), silazane (such as methylsilazane, and ethylsilazane), nitrogen gas, or ammonia gas may be utilized. These materials may also be utilized by combining them.

Also, the film may be formed by utilizing a plurality of gases of the same type among these gases. In a case when gases of the same type are utilized, the conditions of disassociation are different for both because the electron density or the electron temperature in the area where each gas is supplied, is different. As a result, the gas components, if different types of gases are utilized, may coexist in the area. By using this method, low cost gases may be utilized instead of high cost gases. And, a film with a construction similar to that of the film formed by using high-cost gas, can be formed.

In the present invention, for example, the material gases described above may be supplied to each area and reacted after forming a plurality of areas with different electron densities or electron temperatures. In this case, the electron density and the electron temperature may be changed with time or by each step within the range of electron densities and electron temperatures described above. Among these plurality of areas, the areas to change the electron density or the electron temperature may not necessarily include all areas. For example, the electron density or the electron temperature may be changed for only two out of three areas.

Specifically, for example, a first material (tri-methylsilan) is processed to have a predetermined electron density and electron temperature, a second material (tri-methylsilan) is processed to have an electron density and an electron temperature different from that of the first processed material, and these materials are reacted with a third material (such as an ammonia gas), thereby forming a film. Consequently, a film, in which characteristics different from that of one processed with tri-methylsilan, can be formed without changing the electron density and the electron temperature.

The following effects can be obtained by processing a plurality of materials in an area that is different in electron density or electron temperature, and forming a film in this way. For example, in a case when forming a film on a preformed film (such as $C_5F_8$), excessive dissociation of the preformed film can be suppressed when forming a film using high-electron density and a low-electron temperature. When the film is excessively disassociated, it becomes an etching species and is unable to contribute to forming. When excessive disassociation of the preformed film can be prevented, the preformed film becomes a relatively C-rich decomposition product, and thereby becomes a film forming species.

As a result, a more diamond-like structure (a C-rich structure) can be formed compared to the quality of the film formed by a conventional method, thereby a significant improvement in thermal resistance of the film can be made. For example, in a case when Teflon (polytetrafluoroethylene; PTFE) is utilized as a preformed film (such as a CFx film), the melting-point of the film formed by the conventional method is approximately 330 degree/C. However, the allowable temperature limit for the film formed by the method according to the present invention is approximately 400 degree/C at least.

Further, by changing the electron temperature and the electron density, a film's superficial composition and interior composition can be changed. For example, when the film's superficial structure is high in dielectric constant and mechanical strength, however, it may be configured to a structure relatively low in mechanical strength and low in dielectric constant. And, in order to increase the mechanical strength or the thermal strength of the film, a post film forming process called cure is generally used for a Low-k material, however, such a process can be eliminated by using the method according to the present invention.

Meanwhile, in addition to the method for adjusting the electron density and the electron temperature described above, the effect described above can further be exerted by adjusting the flow ratio of the material gas supplied to the reaction area. When adjusting the flow ratio of the material gas, the type of material gas to be used may be any number of types. At this time, the gas which adjusts the flow ratio may be any number of different material gases. For example, when forming a film using three types of material gas, the adjustment of the flow ratio may be made only for two types of material gas.

In a case when creating a plurality of areas with different electron densities or electron temperatures and reacting a plurality of material gasses thereon while forming a film on a substrate, the position of the areas is not specifically limited. The positions of the area may be adjusted as needed, for example, by creating the area for supplying the first material on a position near the substrate, and creating a field for supplying the second material on a position far from the substrate. Conversely, it may be such that creating the area for supplying the second material is near the substrate, and creating the area for supplying the first material is on the position far from the substrate. Also, an area for supplying the third material may be created between the area for supplying the first material and the area for supplying the second material.

Next, a CVD device for generating plasma using RLSA is hereinafter explained. FIG. 1 is a schematic view of a vertical section of a plasma film forming device 1 according to the present invention. This plasma forming device 1 is a CVD device for generating plasma using RLSA.

The plasma film forming device 1 is provided with, for example, a treatment vessel 2 in a cylindrical form with an opening in a top face. The treatment vessel 2 is formed, for example, from an aluminum alloy. The treatment vessel 2 is grounded. A placing base 3 for placing, for example, the substrate 21, is provided on the center of the bottom of the treatment vessel 2.

On the placing base 3, for example, an electrode plate 4 is embedded, and the electrode plate 4 is connected, for example, to a high-frequency power source for a bias 5 of 13.56 MHz, which is externally provided to the treatment vessel 2. By this high-frequency power source for bias 5, charged particles in the plasma can be pulled in using the surface of placing base 3 as a cathode electrode. The electrode plate 4 is also connected to a direct current power source (not shown), and is capable of electrostatically absorbing the substrate 21 onto the placing base 3 by generating an electrostatic force on the surface of the placing base 3.

Inside the placing base 3, provided is a cooling jacket 6, which is a temperature regulator, for example, that circulates a cooling medium. The cooling jacket 6 is connected to a cooling medium temperature regulator 7 for regulating the temperature of the cooling medium. A temperature control 8 controls the temperature of the cooling medium at the cooling medium temperature regulator 7. Thus, the temperature control 8 sets the cooling medium temperature of the cooling medium temperature regulator 7, and the cooling medium temperature regulator 7 adjusts the temperature flow into the cooling jacket 6, thereby the temperature of the placing base 3 can be controlled. As a result, the substrate 21 placed on the placing base 3 may be maintained at a temperature not more than a predetermined temperature.

On the upper opening of the treatment vessel 2, provided is a shower ring 11 as a plasma gas supply structure, through a sealing material 10, such as an O-ring to secure airtightness. Inside the treatment vessel 2 is closed by this shower ring 11. On the upper side of the shower ring 11, provided is a cover plate 12, and radial line slot antennas 13 are provided on the upper portion of the cover plate 12 as a high-frequency wave supply unit to supply microwaves for plasma generation.

The shower ring 11 is formed, for example, in a disk shape, and arranged so as to face the placing base 3. High dielectric materials, such as aluminum nitride are utilized for the shower ring 11.

Onto the shower ring 11, formed is a plurality of feed gas supplying holes 14, which penetrate in vertical directions. Further, on to the shower ring 11, formed is a gas supplying pipe 15, which horizontally passes through inside the shower ring 11 from the side face of the treatment vessel 2, and communicates with the upper face from the center of the shower ring 11. Onto the upper face of the shower ring 11, where the gas supplying pipe 15 communicates, formed is a groove, and a gas passage 16 is formed between the shower ring 11 and the cover plate 12. The gas passage 16 communicates with the gas supply hole 14. Thus, the plasma gas supplied to the gas supplying pipe 15 is transferred to the gas passage 16 though the gas supplying pipe 15, and supplied to the treatment vessel 2 through each gas supplying hole 14 from the gas passage 16.

The gas supplying pipe 15 communicates with, for example, three gas sources, which are provided externally to the treatment vessel 2, a first gas supply source 17, a second supply source 18, and a third gas supply source 19. The gas may be enclosed within each of the first, the second, and the third gas supply sources 17, 18 and 19. Then, the gases may be supplied in the treatment vessel 2.

In the first, the second, and third gas supplying sources 17, 18, and 19, methylsilane (such as, mono-methylsilane, di-methylsilane, tri-methylsilane, or tetra-methylsilane), or silazane (such as methylsilazane, and ethylsilazane) may be enclosed. Also, in the gas supplying sources 17, 18, and 19, nitrogen gas, or ammonia gas may be enclosed. Further, in the gas supplying sources 17, 18, and 19, a noble gas, such as, argon gas or hydrogen may be enclosed. In the gas supplying sources 17, 18, and 19, the flow rate of the gas may also be adjusted. The adjustment of the flow rate of the gas may be performed with time or by each step of forming a film, thereby allowing adjustment according to the characteristics or types of film desired.

The cover plate 12 is adhered to the upper face of the shower ring 11 through a sealing member 20, such as an O-ring. The cover plate 12 is formed by a dielectric body, such as $Al_2O_3$.

The radial line slot antennas 13 are provided with an antenna main body 30 in a virtually cylindrical form with an opening on the lower face. A slot plate 31, which has a plurality of slots formed, in a disk shape is provided on the opening on the lower face of the antenna main body 30. On the upper portion of the slot plate 31 in the antenna main body 30, provided is a retardation plate 32 formed by a low-loss dielectric material. On the upper portion of the antenna main body 30, connected is a coaxial wave guide 34, which leads to a microwave oscillator 33. The microwave oscillator 33 is provided externally to the treatment vessel 2, and is capable of oscillating microwaves of a predetermined frequency, such as 2.45 GHz, against the radial line slot antennas 13. By this configuration, the microwaves oscillating from the microwave oscillator 33 are emitted towards the inside of the treatment vessel 2 though the cover plate 12 and the shower ring 11 after transmission in the radial line slot antennas 13, compressed into a short-wave length by the retardation plate 32, and generate a circular polarized wave by the slot plate 31.

The microwave oscillator 33 is provided with a frequency controller (not shown), and the frequency of the microwave oscillated from the microwave oscillator 33 can be adjusted by adjusting the frequency controller. By adjusting the frequency of the microwave, the electron density and the electron temperature in the plasma exciting area 36 and the plasma diffusing area 37 can be adjusted. The retardation plate 32 compresses the microwave into a short wave-length, and by adjusting this retardation place 32, the electron density and the electron temperature in the plasma areas 36 and 37 can be adjusted. For example, a timer instrument may be provided to the microwave oscillator 33 or retardation plate 32. And the electron density and the electron temperature in the plasma areas 36 and 37 may be adjusted with time using the timer instrument.

Between the placing base 3 and the shower ring 11 inside the treatment vessel 2, provided is a feed gas supplying structure 40, for example, in a virtually flat plate form. With respect to the feed gas supplying structure 40, the outer shape is formed in a disk shape at least larger than the diameter of the substrate viewed from a plane face, and the structure is arranged so as to face the placing base 3 and the shower ring 11. By this feed gas supplying structure 40, the inside of the treatment vessel 2 is divided into a plasma exciting area 36 on the shower ring 11 side, and a plasma diffusing area 37 on the placing base 3 side.

Figure 2:
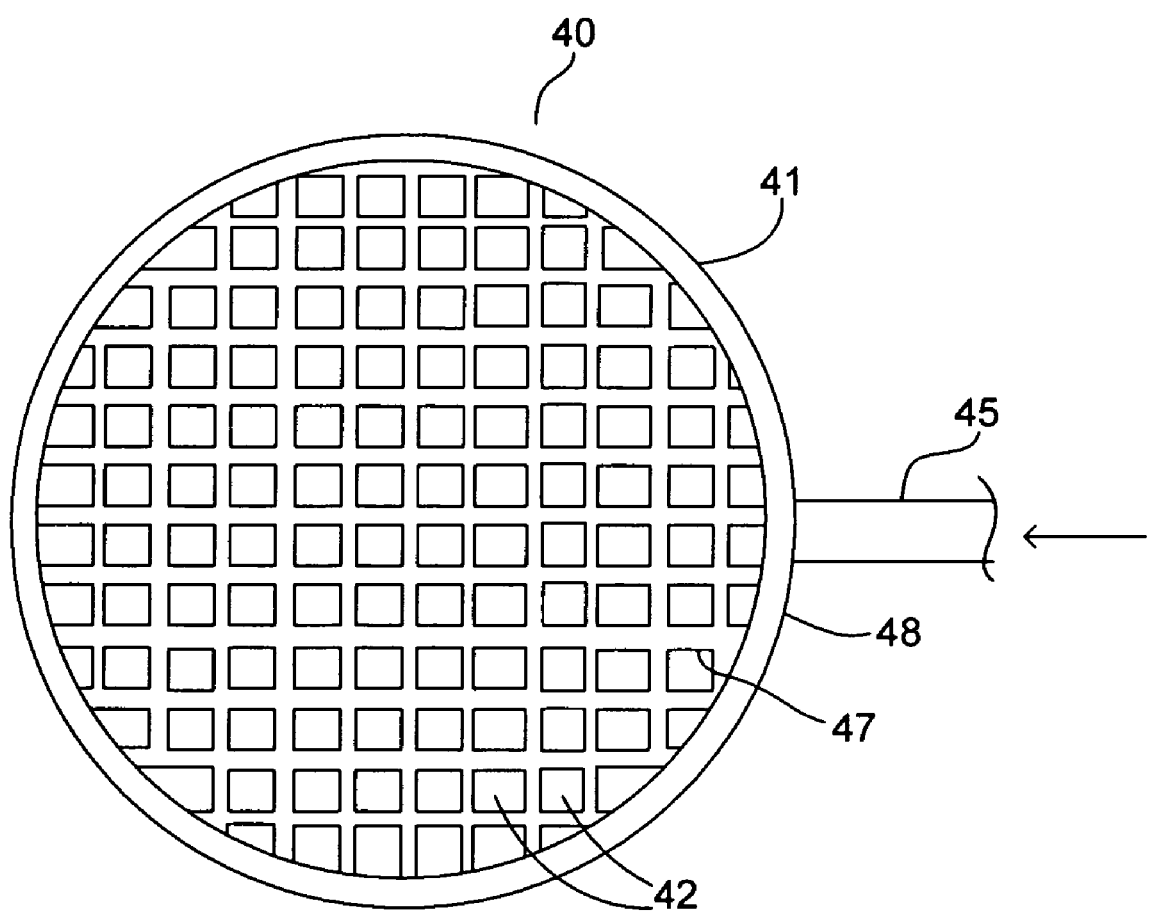
FIG. 2 is a plane view of a feed gas supplying structure.

The feed gas supplying structure 40 is configured by continuous feed gas supplying pipes 41 arranged in a virtual lattice shape on an identical plane as shown in FIG. 2. The feed gas supplying pipes 41 are configured by, for example, a circular pipe 47 which is circularly arranged on the outer circumference of the feed gas supplying structure 40, and a lattice shaped pipe 48, which arranges a plurality of vertical and horizontal pipes so as to orthogonally cross inside the circular pipe 47. With respect to these feed gas supplying pipes 41, the longitudinal section is formed in a rectangular shape viewed from an axial direction, and all of them communicate with each other.

Further, onto the clearance between the feed gas supplying pipes 41 arranged in a lattice shape in the feed gas supplying structure 40, formed is a plurality of openings 42. The plasma generated in the plasma exciting area 36 on the upper side of the feed gas supplying structure 40 passes through these openings 42 and enters into the plasma diffusing area 37 on the placing base 3 side. The plurality of openings 42 are formed such that the transmissivity L of the plasma is not less than 25%, for example, about 30% to 80%. This transmissivity L of the plasma can be indicated by a formula (1):

$$L = \frac{\text{Total opening are of the openings 42}}{\text{Plane area of the feed gas supplying structure 40}} e^{\frac{\alpha t}{d}} \quad (1)$$

($\alpha$ in the formula (1) is a profile coefficient of the openings 42 indicated by a diffusion equation of the plasma, t is a thickness of the feed gas supplying structure 40, and d is a dimension of one opening 42.)

For example, in a case when the plane area of the feed gas supplying structure 40 is $0.07 \text{ m}^2$, the total opening area of the openings 42 is $0.05 \text{ m}^2$, and the shape viewed from the plane of the openings 42 is a square where the length d of one end is 25.9 mm, the profile coefficient $\alpha$ is −4.44 by the diffusion equation of the plasma. In a case when the thickness t of the feed gas supplying structure 40 is 3.2 mm, the tranmissivity L of the plasma is 41% by the formula (1).

By adjusting the opening area, the form, the dimension of the opening 42, the plasma pass rate may be configured arbitrarily. By adjusting this plasma pass rate, the electron density and the electron temperature in the plasma diffusing area 37 can be adjusted. At this time, for example, a timer instrument for adjusting the opening 42 may be provided. And the electron density and the electron temperature in the plasma diffusing areas 37 may be adjusted with time using the timer instrument.

The dimension of each opening 42 is, for example, configured to be shorter than the wavelength of the microwaves emitted from the radial line slot antennas 13. In this way, the microwaves supplied from the radial line slot antennas 13 are reflected at the feed gas supplying structure 40, thereby preventing the microwaves from entering into the plasma diffusing area 37. As a result, the damage to the substrate by the microwaves can be prevented without directly exposing the substrate 21 on the placing base 3 to the microwaves. The surface of the feed gas supplying structure 40, that is, the surface of the feed gas supplying pipes 41 is coated, for example, by a non-conducting film, which prevents the feed gas supplying structure 40 from spattering by the charged particle on the plasma, thereby preventing the metal contamination of the substrate by the particle spattered by the spattering.

Figure 3:
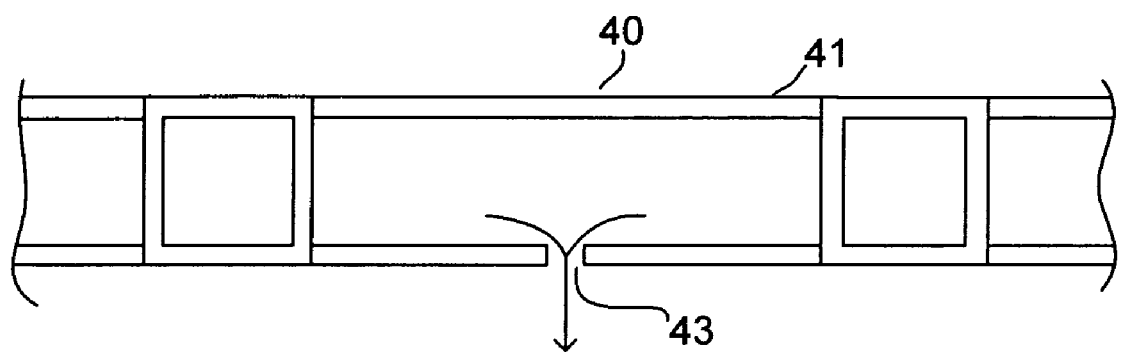
FIG. 3 is a schematic view of a longitudinal section showing a structure of feed gas supplying pipes of a feed gas supplying structure.

On the lower face of the feed gas supplying pipes 41 of the feed gas supplying structure 40, a plurality of feed gas supplying openings 43 are formed as shown in FIGS. 1 and 3. These feed gas supplying openings 43 are equally arranged in the face of the feed gas supplying structure 40. In addition, the feed gas supplying openings 43 may be equally arranged on an area facing the substrate 21 placed on the placing base 3. The feed gas supplying pipes 41 are connected to a gas pipe 45, which is communicated with the feed gas supplying source 44 provided externally to the treatment vessel 2 as shown in FIG. 1. In the feed gas supplying source 44, the feed gas is enclosed. The material gas supplied from the feed gas supplying source 44 to the feed gas supplying pipes 41 through gas pipes 45 is discharged from each feed gas supplying opening 43 towards the plasma diffusing area 37 located on the lower side.

In the feed gas supplying source 44, for example, methylsilane (such as, mono-methylsilane, di-methylsilane, tri-methylsilane, or tetra-methylsilane), or silazane (such as methylsilazane, and ethylsilazane), may be enclosed. Also, in the gas supplying sources 17, 18, and 19, nitrogen gas, or ammonia gas may be enclosed. Further, in the gas supplying sources 17, 18, and 19, a noble gas, such as, argon gas or hydrogen may be enclosed. In the gas supplying sources 17, 18, and 19, the flow rate of the gas may also be adjusted. The adjustment of the flow rate of the gas may be performed with time or by each step of forming a film, thereby allowing adjustment according to the characteristics or types of the film desired.

On the bottom of the treatment vessel 2, provided is an exhaust opening 50 to exhaust an atmosphere inside the treatment vessel 2. The exhaust opening 50 is connected to an exhaust pipe 52, which leads to an exhaust device 51, such as a turbo molecular pump. The inside of the treatment vessel 2 can be decompressed to a predetermined pressure by the exhaust from this exhaust opening 50.

Next, a plasma film forming process performed in the plasma film forming device 1, which is configured as described above, is hereinafter explained. First, the substrate 21 is transferred into the treatment vessel 2, and vacuumed and retained on the placing base 3. At this time, a cooling medium in a low ambient temperature, such as 23 degree/C. is circulating in the cooling jacket 6 by the setting of the temperature control 8, thereby the placing base 3 is maintained in an ambient temperature. Thus the substrate 21 placed on the placing base 3 is maintained in the ambient temperature. Subsequently, the exhaust from the treatment vessel 2 is begun by the exhaust device 51, and the pressure inside the treatment vessel 2 is reduced to a predetermined pressure, such as 13.3 Pa (100 mTorr).

When the inside the treatment vessel 2 is decompressed, the plasma gas of argon gas and hydrogen gas, or ammonia gas, nitrogen gas, and $CO_2$ gas are supplied from the showerhead 11 towards the plasma exiting area 36. Also, from the radial line slot antennas 13, a microwave of, for example, 2.45 GHz is radiated to the plasma exciting area 36 located right below. By this radiation of the microwave, the plasma gas is plasma excited in the plasma exciting area 36, and for example, the nitrogen gas is ionized or radicalized. At this time, the microwave progressing downward is reflected at the feed gas supplying structure 40 and remains in the plasma exiting area 36. As a result, a high-density plasma is generated in the plasma exiting area 36.

Meanwhile, a cathodic voltage is applied to the placing base 3 by the high-frequency power source for bias 5, and the plasma in the plasma exciting area 36 passes through the openings 42 of the feed gas supplying structure 40 and diffuses inside the plasma diffusing area 37 located on the lower side of the feed gas supplying structure 40. The SiC based gas (mono-methylsilan, di-methylsilan, or tri-methylsilan, etc.), which is a material gas, is supplied to the plasma diffusing area 37 from the feed gas supply opening 43 of the feed gas supplying structure 40. The SiC based gas is, for example, radicalized by the plasma supplied from the upper side. By this radical, or the radical from the nitrogen gas supplied from the plasma exciting area 36 described above, the film, which consists of the SiC based gas and the nitrogen atom, is formed and grown on the substrate 21.

As the growth of the film progresses and the film of a predetermined thickness is formed on the substrate 21, the microwave radiation, and the supply of the material gas and plasma gas is stopped. Thereafter, the substrate 21 is transferred from the treatment vessel 2, thereby the plasma film forming process is completed. The substrate 21 completed with the plasma film forming process is patterned by, for example, the photolithography method, and a gate film of a predetermined shape is formed from the film. Further, an electrode film is laminated by the photolithography method, thereby, for example, a capacitor of a MIS (Metal Insulator Semiconductor) structure is formed.

Figure 4:
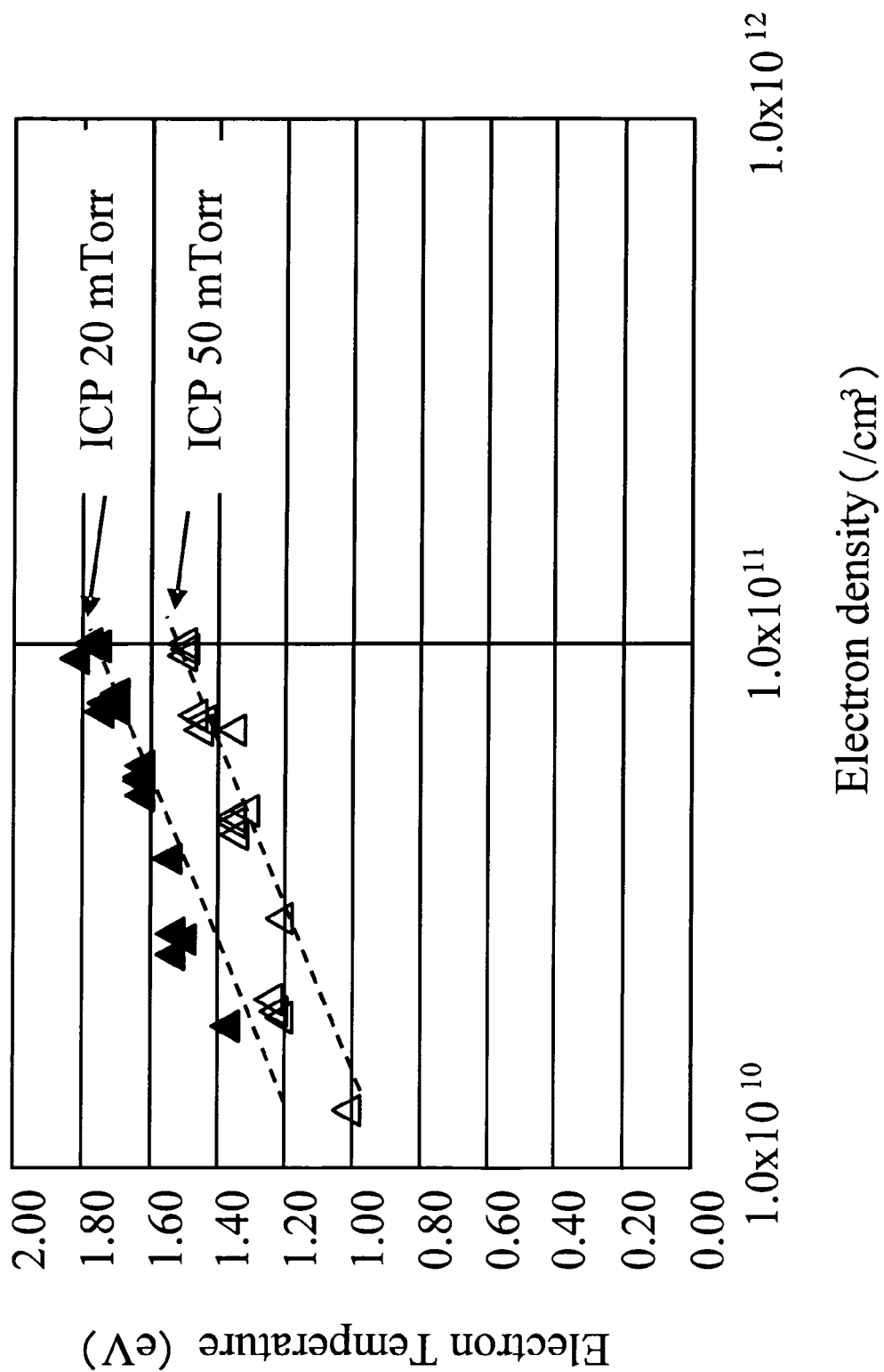
FIG. 4 illustrates an adjustment of electron densities and electron temperatures using an ICP device.

Next, explained is a device for adjusting the electron density and the electron temperature. FIG. 4 illustrates an adjustment of the electron density and the electron temperature using an ICP device. The black triangles in FIG. 4 indicate the electron densities and the electron temperatures in a case where the pressure inside the ICP device is set to 20 mTorr. The white triangles in FIG. 4 indicate the electron density and the electron temperature in a case where the pressure inside the ICP device is set to 50 mTorr. As it can be seen from the figure, the condition of high-electron density and low-electron temperature can not be created regardless of the setting of the pressure in the ICP device.

Figure 5:
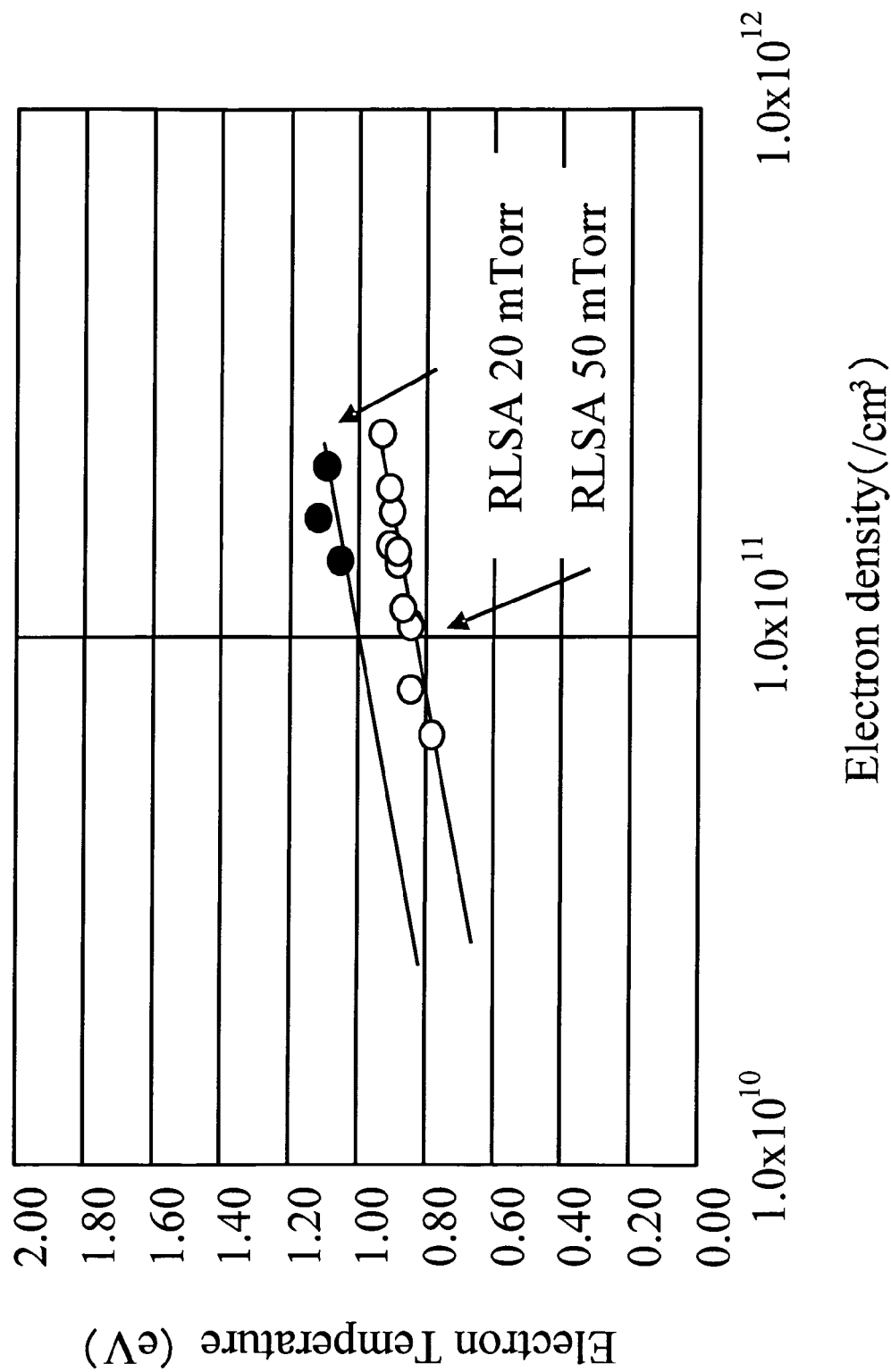
FIG. 5 illustrates an adjustment of electron densities and electron temperatures using a RLSA device.

FIG. 5 illustrates an adjustment of the electron density and the electron temperature using a RLSA device. The black dots in FIG. 5 indicate the electron densities and the electron temperatures in a case where the pressure inside the RLSA device is set to 20 mTorr. The white dots in FIG. 5 indicate the electron densities and the electron temperatures in a case where the pressure inside the RLSA device is set to 50 mTorr. As it can be seen from the figure, in a case when the RLSA device is used, the range of electron density is approximately $6.0 \times 10^{10}/cm^3$ to $5.0 \times 10^{11}/cm^3$, and the range of the electron temperature is approximately 0.70 eV to 1.20 eV. In this way, in a case when the RLSA device is used, a condition of high electron density and low electron temperature can be created. Further, as it can be seen from the white dots and black dots in the figure, an adjustment can be made to various electron density values and electron temperature values.

One embodiment of the present invention is explained above, however, the present invention is not limited to the above specific example. For example, a film is formed on a substrate, however, the method for forming a film according to the present invention may be applied for forming other films, such as an electrode film. Also, other gases, such as xenon gas, or krypton gas, may be utilized as the plasma gas supplied from the shower ring 11. Further, the method for forming a film according to the present invention can be applied not only to the substrate of the semiconductor device, but also, for example, to the substrates for manufacturing liquid crystal display devices or organic EL elements.

What is claimed is:

1. A plasma processing method for forming a film on a substrate, the method comprising the steps of:
    processing a first material gas with a first plasma having an electron density W and an electron temperature X;
    processing a second material gas with a second plasma having an electron density Y, which is different from the electron density W, and an electron temperature Z, which is different from the electron temperature X; and
    forming the film on the substrate by reacting the processed first material gas and the processed second material gas, wherein the first material gas and the second material gas both contain a methylsilane, the first material gas and the second material gas both contain a silazane, the first material gas contains a methylsilane and the second material gas contains a silazane, or the first material gas contains a silazane and the second material gas contains a methylsilane.

2. The plasma processing method of claim 1, wherein each value of the electron densities W and Y is in a range of $6.0 \times 10^{10}$/cm$^3$ to $5.0 \times 10^{11}$/cm$^3$, and each value of the electron temperatures X and Z is in a range of 0.70 eV to 1.20 eV.

3. The plasma processing method of claim 1, wherein each value of the electron densities W and Y is in a range of $8.0 \times 10^{10}$/cm$^3$ to $5.0 \times 10^{11}$/cm$^3$, and each value of the electron temperatures X and Z is in a range of 0.70 eV to 1.10 eV.

4. The plasma processing method of claim 1, wherein each value of the electron densities W and Y is in a range of $1.0 \times 10^{11}$/cm$^3$ to $5.0 \times 10^{11}$/cm$^3$, and each value of the electron temperatures X and Z is in a range of 0.80 eV to 1.00 eV.

5. The plasma processing method of claim 1, wherein at least one value of the electron densities W and Y are controlled with reference to a time period.

6. The plasma processing method of claim 1, wherein at least one value of the electron temperatures X and Z are controlled with reference to a time period.

7. The plasma processing method of claim 1, wherein each value of the electron densities W and Y for forming an interior component of the film is different from each value of the electron densities W and Y for forming a superficial component of the film.

8. The plasma processing method of claim 1, wherein each value of the electron temperatures X and Z for forming an interior component of the film is different from each value of the electron temperatures X and Z for forming a superficial component of the film.

9. The plasma processing method of claim 1, wherein the method further comprises the steps of:
flowing the first material gas into a first area to process the first material gas with the plasma; and
flowing the second material gas into a second area to process the second material gas with the plasma.

10. The plasma processing method of claim 9, wherein the first area is an area near the substrate and the second area is an area away from the substrate.

11. The plasma processing method of claim 9, wherein the method further comprises a step of controlling a flow ratio of the first material gas and the second material gas.

12. The plasma processing method of claim 11, wherein the flow ratio is controlled with reference to a time period.

13. The plasma processing method of claim 11, wherein the flow ratio for forming an interior component of the film is different from the flow ratio for forming a superficial component of the film.

14. The method of claim 1, wherein the first material gas contains a methylsilane and the second material gas contains a silazane, or the first material gas contains a silazane and the second material gas contains a methylsilane.

15. A processing method for producing a film on a substrate, the method comprising the steps of:
flowing a first material gas into a first area;
treating the first material gas by exposure to an electron density W and an electron temperature X;
flowing a second material gas into a second area, wherein the first area is an area near the substrate and the second area is an area away from the substrate;
treating the second material gas by exposure to an electron density Y, which is different from the electron density W, and an electron temperature Z, which is different from the electron temperature X;
flowing a third material gas into a third area between the first area and the second area; and
producing the film on the substrate by reacting the treated first material gas and the treated second material gas.

16. The processing method of claim 15, wherein each value of the electron densities W and Y is in a range of $6.0 \times 10^{10}$/cm$^3$ to $5.0 \times 10^{11}$/cm$^3$, and each value of the electron temperatures X and Z is in a range of 0.70 eV to 1.20 eV.

17. The processing method of claim 15, wherein each value of the electron densities W and Y is in a range of $8.0 \times 10^{10}$/cm$^3$ to $5.0 \times 10^{11}$/cm$^3$, and each value of the electron temperatures X and Z is in a range of 0.70 eV to 1.10 eV.

18. The processing method of claim 15, wherein each value of the electron densities W and Y is in a range of $1.0 \times 10^{10}$/cm$^3$ to $5.0 \times 10^{11}$/cm$^3$, and each value of the electron temperatures X and Z is in a range of 0.80 eV to 1.00 eV.

19. The processing method of claim 15, wherein at least one value of the electron densities W and Y are controlled with reference to a time period.

20. The method of claim 15, wherein the method further comprises a step of controlling a flow ratio of the first material gas and the second material gas.

21. A processing method for producing a film on a substrate, the method comprising the steps of:
flowing a first material gas into a first area;
processing a first material gas in a first area with a first plasma having an electron density W and an electron temperature X;
flowing a second material gas into a second area separated from the first area by a plurality of openings, wherein the first area is an area near the substrate and the second area is an area away from the substrate;
treating the second material gas in the second area with a second plasma having an electron density Y, which is different from the electron density W, and an electron temperature Z, which is different from the electron temperature X; and
producing the film on the substrate by reacting the treated first material gas and the treated second material gas, wherein the first plasma in the first area and the second plasma in the second area are separated by the plurality of openings and the plasma pass rate of the plurality of openings is adjusted during the producing to adjust the electron density Y and the electron temperature Z in the second area.

22. The method of claim 21, wherein the plasma pass rate of the plurality of openings is adjusted by adjusting the opening of the plurality of openings.

* * * * *